United States Patent
Seo (12)

(10) Patent No.: US 6,323,521 B1
(45) Date of Patent: Nov. 27, 2001

(54) THIN FILM TRANSISTOR WITH ELECTRODES HAVING COMPRESSIVE AND TENSILE STRESS

(75) Inventor: Hyun-Sik Seo, Kyongki-do (KR)

(73) Assignee: LG LCD, Inc., Seoul (KR)

( * ) Notice: Subject to any disclaimer, the term of this patent is extended or adjusted under 35 U.S.C. 154(b) by 0 days.

(21) Appl. No.: 09/184,824

(22) Filed: Nov. 2, 1998

(30) Foreign Application Priority Data

Nov. 1, 1997 (KR) .................................................. 97-57546

(51) Int. Cl.[7] ....................................................... H01L 29/00
(52) U.S. Cl. ............................. 257/347; 257/59; 257/282; 257/283; 257/284; 257/285
(58) Field of Search ................................... 257/347–355, 257/382–385, 59

(56) References Cited

U.S. PATENT DOCUMENTS 5,808,315 * 9/1998 Murakami et al. ..................... 257/59
5,942,767 * 8/1999 Na et al. ................................ 257/382
6,025,634 * 2/2000 Teong .................................... 257/383

FOREIGN PATENT DOCUMENTS 9-148586   6/1997   (JP) .

* cited by examiner

Primary Examiner—Fetsum Abraham
(74) Attorney, Agent, or Firm—Birch, Stewart, Kolasch & Birch, LLP

(57) ABSTRACT

A thin film transistor includes a substrate, a gate electrode on the substrate, a gate insulating layer on the substrate and covering the gate electrode, an active layer on the gate insulating layer, an ohmic contact layer on the active layer and not overlapping the gate electrode, and a source electrode and a drain electrode connected to the ohmic contact layer. Each of the source electrode and the drain electrode has a double-layered structure of a first metal layer having tensile stress and a second metal layer having compressive stress.

26 Claims, 6 Drawing Sheets

THIN FILM TRANSISTOR WITH ELECTRODES HAVING COMPRESSIVE AND TENSILE STRESS

BACKGROUND OF THE INVENTION

1. Field of the Invention

The present invention relates to a thin film transistor ("TFT") and a method for fabricating the same and, more particularly, to a TFT and a method for fabricating the same in which the resistance of the source and the drain is reduced.

2. Discussion of Prior Art

A Liquid Crystal Display ("LCD") has a plurality of pixel cells which include a switching device as a driving element and a pixel electrode as its basic units which are arranged in a matrix pattern. The switching device is a TFT including a gate region, a source region and a drain region.

TFTs are classified as top gate type TFTs in which a gate electrode is formed over an active region and bottom gate type TFTs in which a gate electrode is formed below an active region according to the relative position of the active region and the gate.

FIG. 1 is a cross-sectional view of a bottom gate type TFT of a conventional device.

A gate electrode 13 consisting of a conductive material, such as Al is formed on an insulating substrate 11. A gate insulating layer 15 consisting of an insulating material, such as silicon oxide or silicon nitride is formed on the substrate 11 so as to cover the gate electrode 13. An active layer 17 consisting of amorphous silicon is formed on the gate insulating layer 15 over the gate electrode 13. An ohmic contact layer 19 consisting of heavily-impurity-doped-amorphous silicon is formed on the active layer 17 so as not to overlap the gate electrode 13.

A source electrode 21 and a drain electrode 22 are formed on the ohmic contact layer 19. The source and drain electrodes 21 and 22 are formed by a refractory metal material, such as Cr or Ta. A passivation layer 23 consisting of an insulating material, such as silicon oxide or silicon nitride is formed on the entire surface of the resultant structure. A contact hole 25 is formed in the passivation layer 23 to expose a portion of the drain electrode 22. A pixel electrode 27 is formed on the passivation layer 23 and is electrically connected to the exposed drain electrode 22. The pixel electrode 27 is formed by a transparent material, such as Indium Tin Oxide ("ITO").

FIG. 2 is a cross-sectional view of a top gate type TFT according to a conventional device.

An active layer 33 consisting of amorphous silicon is formed on an insulating substrate 31. A gate insulating layer 35 and a gate electrode 37 are formed sequentially on the active layer 33. A source region 41 and a drain region 42 are formed in the active layer 33. The source and drain regions 41 and 42 are heavily doped by N-type impurities or P-type impurities.

An insulating interlayer 35 consisting of an insulating material, such as silicon oxide or silicon nitride is formed on the entire surface of the resultant structure. First contact holes are formed in the insulating interlayer 35 to expose a portion of the source region 41 and a portion of the drain region 42. A source electrode 44 connected to the exposed source region 41 and a drain electrode 45 connected to the exposed drain region 42 are formed on the insulating interlayer 35. The source and drain electrodes 44 and 45 are formed from a refractory metal material, such as Cr or Ta.

A passivation layer 47 consisting of an insulating material, such as silicon oxide is formed on the insulating interlayer 39 covering the source and drain regions 41 and 42. A second hole 49 is formed in the passivation layer 47 to expose a portion of the drain electrode 45. A pixel electrode 51 is formed on the passivation layer 47 and electrically connected to the exposed drain electrode 45. The pixel electrode 51 is formed of a transparent material, such as ITO.

As described above, the source and drain electrodes are formed by a refractory metal material, such as Cr or Ta in the bottom gate type TFT and the top gate type TFT according to the prior art devices. When forming the source and drain electrodes using a refractory metal material, such as Cr or Ta, the contact spiking generated in the contact surface of the amorphous silicon layer and the hillock generated in the surface may be prevented.

However, the refractory metal material makes the resistance of the switching device increase, thereby causing a reduction in the switching speed.

SUMMARY OF THE INVENTION

To overcome the problems described above, preferred embodiments of the present invention provide a TFT and a method for fabricating the same that prevent any reduction in switching speed of the TFT by forming the source and the drain electrodes to have significantly low electrical resistance while preventing deterioration of the step coverage by forming the source electrode and the drain electrode to have a double step difference.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, at least one preferred embodiment of the present invention provides a TFT including a substrate, a gate electrode on the substrate, a gate insulating layer on the substrate and covering the gate electrode, an active layer on the gate insulating layer, an ohmic contact layer on the active layer and not overlapping the gate electrode, and a source electrode and a drain electrode connected to the ohmic contact layer, each of the source electrode and the drain electrode having a double-layered structure of a first metal layer having a tensile stress and a second metal layer having a compressive stress.

In another preferred embodiment of the present invention, a TFT includes a substrate, an active layer on the substrate, a gate insulating layer on the active layer, a gate electrode on the gate insulating layer, a source region and a drain region in both sides of the active layer, an insulating interlayer on the substrate and covering the active layer and the gate electrode, first contact holes formed in the insulating interlayer and exposing the source and drain regions, and a source electrode connected to the source region and a drain electrode connected to the drain region, each of the source electrode and drain electrode having a double-layered structure of a first metal layer having tensile stress and a second metal layer having compressive stress.

In another preferred embodiment of the present invention, a method for fabricating a TFT includes the steps of providing a substrate, forming a gate electrode on the substrate, forming a gate insulating layer on the substrate such that the gate insulating layer covers the gate electrode, forming an active layer and an ohmic contact layer on the gate insulating layer, the ohmic contact layer being disposed on the active layer, and forming a source electrode and a drain electrode so as to be connected to the ohmic contact layer, each of the source electrode and the drain electrode having a double-layered structure of a first metal layer having tensile stress and a second metal layer having compressive stress.

In another preferred embodiment of the present invention, a method for fabricating a TFT includes the steps of providing a substrate, forming an active layer on the substrate, forming a gate insulating layer and a gate electrode on the active layer, the gate electrode being formed on the gate insulating layer, forming a source region and a drain region on both sides of the active layer, forming an insulating interlayer on the substrate, the insulating interlayer covering the active layer and the gate electrode, forming first contact holes in the insulating interlayer such that the first contact holes expose the source and drain regions and forming a source electrode connected to the source region and a drain electrode connected to the drain region, each of the source electrode and drain electrode having a double-layered structure of a first metal layer having tensile stress and a second metal layer having compressive stress.

It is to be understood that both the foregoing general description and the following detailed description are exemplary and explanatory and are intended to provide further explanation of preferred embodiments of the present invention as claimed.

BRIEF DESCRIPTION OF THE ATTACHED DRAWINGS

The accompanying drawings, which are included to provide a further understanding of the present invention and are incorporated in and constitute a part of this application, illustrate preferred embodiments of the invention and together with the description serve to explain the principle of the invention. In the drawings.

DETAILED DESCRIPTION OF PREFERRED EMBODIMENTS

Explanation will now be made in detail with reference to preferred embodiments of the present invention, examples of which are illustrated in the accompanying drawings.

Figure 1:
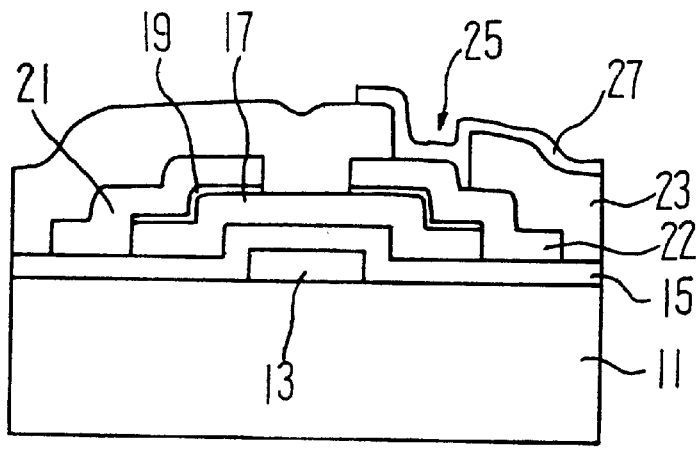
FIG. 1 is a cross-sectional view of a bottom gate type TFT according to a conventional device.
Figure 2:
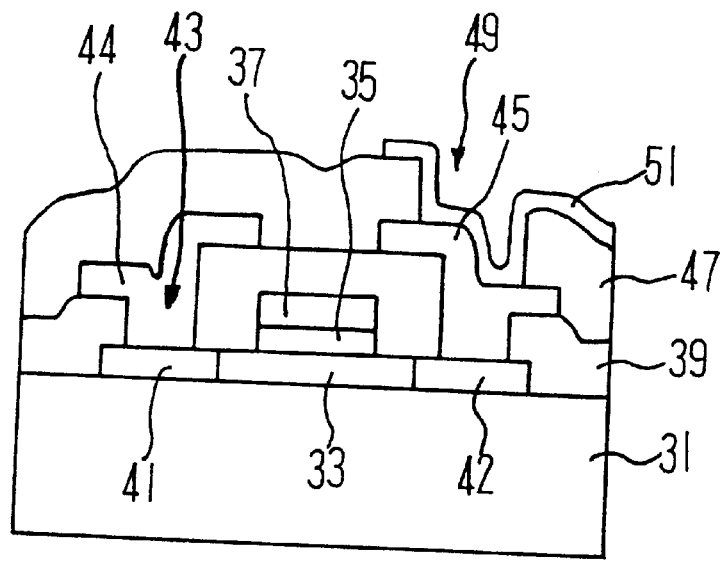
FIG. 2 is a cross-sectional view of a top gate type TFT according to a conventional device.
Figure 3:
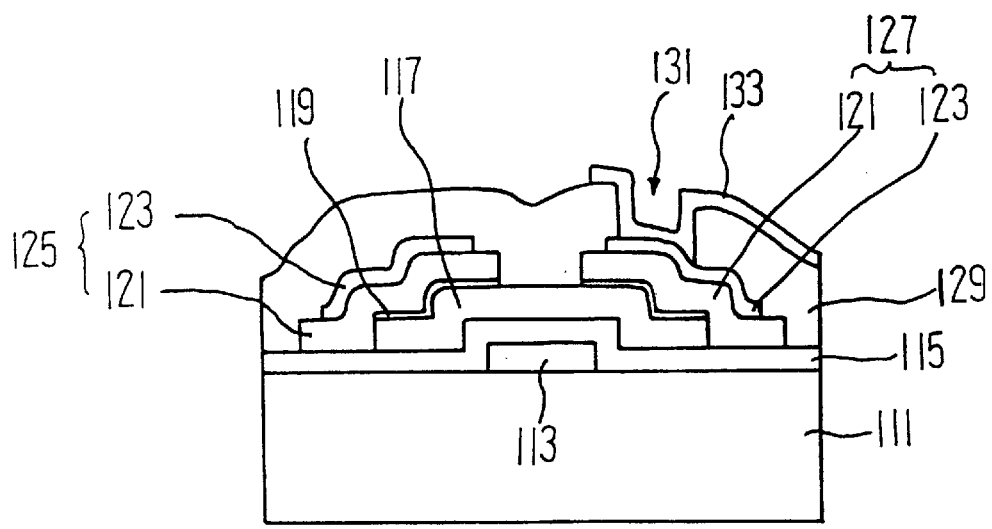
FIG. 3 is a cross-sectional view of a bottom gate type TFT according to a first preferred embodiment of the present invention.

FIG. 3 is a cross-sectional view of a bottom gate type TFT according to a first preferred embodiment of the present invention. The bottom gate type TFT according to this preferred embodiment of the present invention includes a substrate 111, a gate electrode 113, a gate insulating layer 115, an active layer 117, an ohmic contact layer 119, a source electrode 125 and a drain electrode 127, a passivation layer 129 and a pixel electrode 133. Each of the source and drain electrodes 125 and 127 has double-layered structure of a first metal layer 121 and a second metal layer 123.

The gate electrode 113 is formed from a conductive material having low electric resistance and exhibiting tensile stress, such as Al, Cu or other suitable materials. The gate insulating layer is formed on the substrate 111 so as to cover the gate electrode 113. The gate insulating layer 115 may be formed from insulating material, such as silicon oxide silicon nitride or the like.

The active layer 117 is formed on the gate insulating layer 115 over the gate electrode 113. The active layer 117 may be formed from an undoped semiconductor material, such as undoped amorphous silicon, undoped polycrystal line silicon or other suitable material. The ohmic contact layer 119 is formed on the active layer 117 so as not to overlap the gate electrode 113. The ohmic contact layer 119 may be formed from a doped semiconductor material, such as doped amorphous silicon, doped polycrystalline silicon or other suitable material. The ohmic contact layer is doped by N-type or P-type impurities. Each of the source and drain electrodes 125 and 127 has a double-layered structure of the first and second metal layers 121 and 123. The first metal layer 121 may preferably be formed from a conductive material having low electric resistance and exhibiting tensile stress, such as Al, Cu, Au or other suitable materials or metal-silicon alloy material such as AlSi, CuSi, Au or other suitable materials. The second metal layer 123 may preferably be formed from a conductive material having a compressive stress, such as MoW, MoTa, MoNb or other suitable materials.

As a result of the unique structure described above, this preferred embodiment of the present invention prevents the reduction of the switching speed of the TFT because the source electrode 125 and the drain electrode 127 are formed of a material having low resistance and prevents the occurrence a hillock because the compressive stress of the second metal layer 123 minimizes the effect of the tensile stress of the first metal layer 121.

The width of the first metal layer 121 may be the same as that of the second metal layer 123. In addition, when the source electrode 125 and the drain electrode 127 have a double-step difference by making the first metal layer 121 wider than the second metal layer 123, the deterioration of the step coverage of the passivation layer 129 is prevented. The first metal layer 121 having tensile stress is preferably wider than the second metal layer 123 having compressive stress by about 1 $\mu$m to about 4 $\mu$m thereby providing effective prevention of deterioration of step coverage of the later-formed passivation layer 129.

The second metal layer 123 is preferably positioned substantially in the middle of the first metal layer 121, so that both side portions of the first metal layer 121 which have do not have a portion of the second metal layer 123 disposed thereon have substantially the same width as each other The width of each of the side portions is preferably larger than about 0.5 $\mu$m to about 2 $\mu$m.

When the first metal layer 121 is formed of a metal-silicon ally material, such as AlSi, CuSi, AuSi or the like, an additional metal layer (not shown in FIG. 3) having a thickness of about 50~100 Å may be formed under the first metal layer 121. The additional metal layer may be formed of a conductive metal material such as Al, Cu, Au or other suitable materials. The additional metal layer under the first metal layer 121 prevents the silicon alloyed in the first metal layer 121 from remaining during patterning of the source and drain electrodes 125 and 127. Also, since the additional metal layer under the first metal layer 121 has a small thickness, for example, about 50–100 Å, silicon in the ohmic contact layer 119 and the active layer 117 diffuses slightly, thereby preventing the occurrence of the contact spiking.

The pixel electrode 133 is formed on the passivation layer 129 and electrically connected to the drain electrode 127 through a contact hole 131. The pixel electrode 133 is preferably formed of a transparent material, such as ITO.

The pixel electrode 133 is connected to the second metal layer 123 formed of Mo or an Mo alloy, such as MoW, MoTa, MoNb or other suitable materials and is not connected to the first metal layer 121 formed of Al, Cu, Au or other suitable materials. Accordingly, the contact resistance of the pixel electrode 133 formed of ITO and the drain electrode 122 is reduced.

In preferred embodiments of the present invention, the double-layered gate electrode of the first metal layer having low electric resistance and exhibiting tensile stress, such as Al, Cu, Au or other suitable materials and the second metal layer exhibiting tensile stress, such as Mo or Mo alloy comprising MoW, MoTa, MoNb or other suitable materials may be formed.

Figure 4:
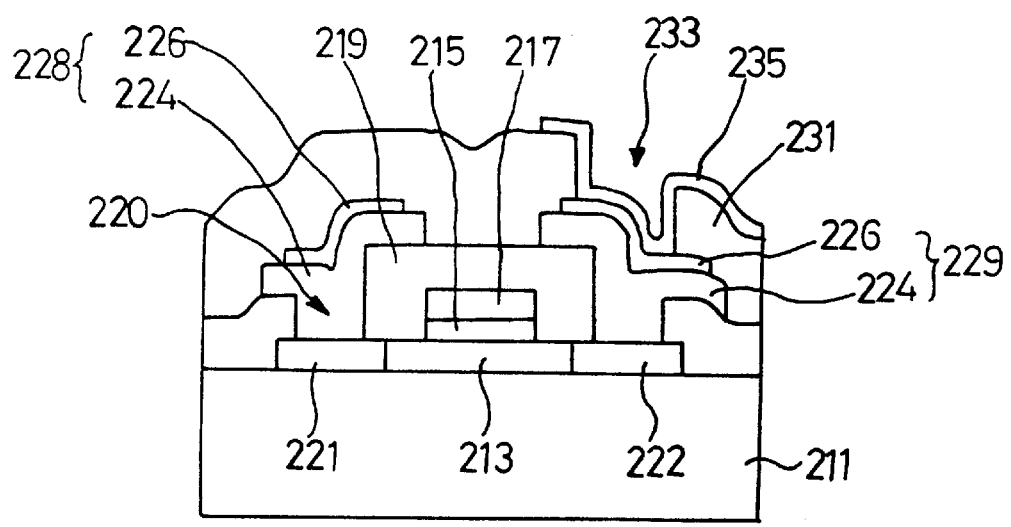
FIG. 4 is a cross-sectional view of a top gate type TFT according to a second preferred embodiment of the present invention.

FIG. 4 is a cross-sectional view of a top gate type TFT according to a second preferred embodiment of the present invention.

The top gate type TFT according to a preferred embodiment of the present invention includes a substrate 211, an active layer 213 having a source region 221 and a drain region 222, a gate insulating layer 215, a gate electrode 217, a gate insulating interlayer 219, a source electrode 228 and a drain electrode 229, a passivation layer 231 and a pixel electrode 235. Each of the source and drain electrodes 228 and 229 have a double-layered structure of a first metal layer 224 and a second metal layer 226

The active layer 213 is preferably formed from semiconductor material such as, amorphous silicon, polycrystalline silicon or the other suitable materials. A source region 221 and a drain region 222 are formed on both sides of the active layer 213. The source and drain regions 221 and 222 are doped heavily by N-type or P-type impurities and a channel region is defined between the source and drain regions 221 and 222 in the active layer 213.

The gate electrode 217 is formed on the gate insulating layer 215 over the channel region of the active layer 213. The gate insulating layer 215 is formed of an insulating material, such as silicon oxide, silicon nitride or other suitable materials. The gate electrode 217 is formed of a conductive layer, such as Al, Cu or other suitable materials.

The insulating interlayer 219 is formed to cover the gate electrode 217. First contact holes 220 are formed in the active layer 213 to expose the source region 221 and the drain region 222.

Each of the source and drain electrodes 228 and 229 has a double-layered structure of the first metal layer 224 and the second metal layer 226, which is the same as the first preferred embodiment of the present invention. Each of the source and drain electrodes 228 and 229 is connected to the source region 221 and the drain region 222, respectively.

The first metal layer 224 may be formed of a conductive material having low electric resistance and exhibiting tensile stress, such as Al, Cu, Au or other suitable materials, or a metal-silicon alloy material, such as AlSi, CuSi, AuSi or other suitable material. The second metal layer 226 may be formed of a conductive material having compressive stress, such as MoW, MoTa, MoNb or other suitable material.

With this unique structure, this preferred embodiment of the present invention prevents the reduction of the switching speed in the TFT because the source electrode 228 and the drain electrode 229 have low electric resistance and prevents the occurrence of a hillock because the compressive stress of the second metal layer 226 minimizes the effect of the tensile stress of the first metal layer 224.

The width of the first metal layer 224 may be the same as that of the second metal layer 226. In addition, when the source electrode 228 and the drain electrode 229 have the double-step difference by making the first metal layer 224 wider than the second metal layer 226, the deterioration of the step coverage of the passivation layer 231 is prevented. Therefore, the first metal layer 224 having tensile stress is preferably wider than the second metal layer 226 having compressive stress, by about 1 μm to about 4 μm to provide effective prevention of deterioration of step coverage of the later-formed passivation layer 231.

The second metal layer 226 is preferably positioned substantially in the middle of the first metal layer 224, so that both side portions of the first metal layer 224 which have no portion of the second metal layer 226 disposed thereon have substantially the same width as each other. The width of each of the side portions is preferably larger than about 0.5 μm to about 2 μm.

When the first metal layer 224 is formed by a metal-silicon alloy material, such as AlSi, CuSi, AuSi or the like, an additional metal layer (not shown in FIG. 4) having a thickness of about 50~100 Å may be formed under the first metal layer 224. The additional metal layer may be formed from a conductive metal material such as Al, Cu, Au or other suitable material. The additional metal layer under the first metal layer 224 prevents the silicon alloyed in the first metal layer 224 from remaining during patterning of the source and drain electrodes 228 and 229. Also, since the additional metal layer under the first metal layer 224 has a small thickness, for example, about 50–100 Å, silicon in the active layer 117 diffuses slightly, thereby preventing the occurrence of contact spiking.

The passivation layer 231 is formed on the insulating interlayer to cover the source electrode 228 and the drain electrode 229. A second contact hole 233 is formed in the passivation layer to expose the drain electrode 229.

The pixel electrode 235 is formed on the passivation layer 231 to connect to the drain electrode 229 through the second contact hole 233. The pixel electrode 235 is formed of a transparent material, such as ITO. The pixel electrode 235 is arranged to contact the second metal layer 226 formed of Mo or an Mo alloy, such as MoW, MoTa, MoNb or other suitable material, and to not contact the first metal layer 224 formed of Al, Cu, Au or other suitable material. Accordingly, the contact resistance of the pixel electrode 235 formed of ITO and the drain electrode 229 is reduced.

In this preferred embodiment of the present invention, the double-layered gate electrode of the first metal layer having low electric resistance and exhibiting tensile stress, such as Al, Cu, Au or other suitable material and the second metal layer exhibiting tensile stress, such as Mo or Mo alloy including MoW, MoTa, MoNb or other suitable material may be formed.

FIGS. 5A to 5D are diagrams illustrating a process for fabricating the TFT according to a third preferred embodiment of the present invention.

Figure 5A:
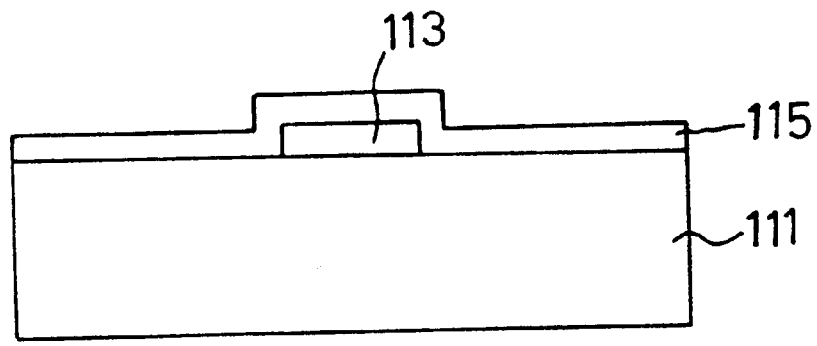
FIGS. 5A to 5D are diagrams illustrating the process for fabricating the TFT according to a third preferred embodiment of the present invention.

Referring to FIG. 5A, a conductive layer is deposited on a substrate 111 by Chemical Vapor Deposition ("CVD") or Physical Vapor Deposition ("PVE") via sputtering and is etched by photolithography to form a gate electrode 113. The conductive layer is preferably formed of a conductive material having low resistance and exhibiting tensile stress, such as Al, Cu, Au or other suitable material. Then, a gate insulating layer 115 is deposited on the substrate 111 to cover the gate electrode 111 via a CVD process. The gate insulating layer 115 may be formed of an insulating material such as, silicon oxide, silicon nitride or other suitable material.

Figure 5B:
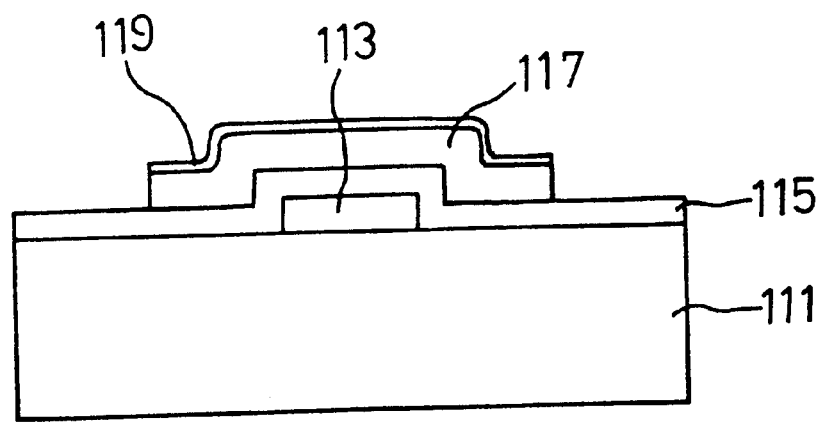

Referring to FIG. 5B, an undoped semiconductor layer, such as an undoped amorphous silicon layer, an undoped polycrystalline silicon layer or the like and a doped semiconductor layer, such as a doped amorphous silicon layer, doped polycrystalline silicon layer, or the like are sequentially deposited by CVD and are etched by photolithography to form an active layer 117 and an ohmic contact layer 119 on the gate insulating layer 113. The doped semiconductor layer is doped by N-type or P-type impurities.

Figure 5C:
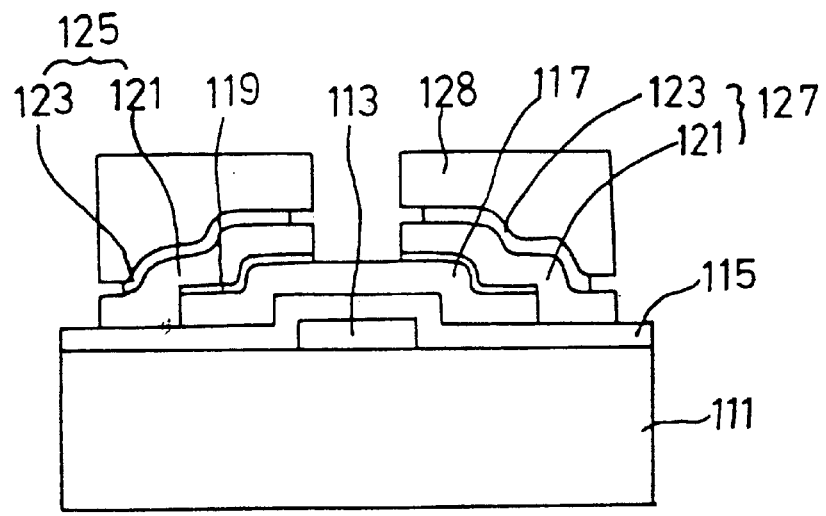

Referring to FIG. 5C, a first metal layer 121 and a second metal layer 123 are sequentially deposited on the gate insulating layer 113 covering the ohmic contact layer 119 by CVD or PVD via sputtering. The first metal layer 121 may be formed of a conductive material having low electrical resistance and exhibiting tensile stress, such as Al, Cu, Au or other suitable material. The second metal layer 123 may be formed of a conductive material having a compressive stress, such as MoW, MoTa, MoNb or other suitable material.

Then, a photoresist pattern 128 is formed on the second metal layer 123. The second metal layer 123 and the first metal layer 121 are sequentially etched using the photoresist pattern as a mask for etching to form a source region 125 and a drain region 127. In this process, a portion of the ohmic layer 119 corresponding to a position of the gate electrode 113 is removed to expose a portion of the active layer 117.

The second metal layer 123 is etched with an etching solution preferably prepared with a mixture of phosphoric acid ($H_2Po_4$), acetic acid ($CH_3COOH$) and nitric acid ($HNO_3$), by means of a wet etching. Since the second metal layer 123 is isotropically etched, a portion of the second metal layer covered with the photoresist pattern 128 as well as an exposed portion thereof is etched by the etching solution.

The second metal layer 123 is preferably etched to have a width that is narrower than the width of the photoresist pattern 128. Each side portion of the second metal layer 123 preferably has a width larger than about 0.5 $\mu$m and less than about 2 $\mu$m. That is, the two side portions of the second metal layer 123 covered with the photoresist pattern 128 are preferably etched to have substantially the same width as each other. The first metal layer 121 is etched by an isotropic etching method, such as Reactive Ion Etching ("RIE") using the photoresist pattern 128 as a mask for etching. Thus, the first metal layer 121 is wider than the second metal layer by a predetermined width, for example, larger than about 1.0 $\mu$m and less than about 4 $\mu$m and the source and drain electrodes 125 and 127 have the double step difference.

As a result of this unique process, this preferred embodiment of the present invention prevents the reduction in the switching speed of the TFT because the first metal layer has a low electrical resistance and prevents the occurrence of a hillock because the compressive stress of the second metal layer 123 minimizes the effect of the tensile stress of the first metal layer.

When the first metal layer 121 is formed by a metal-silicon alloy material, such as AlSi, CuSi, AuSi or other suitable material, an additional conductive layer (not shown in FIGS. 5A–5D) having a thickness of about 50~100 Å may be formed under the first metal layer 121. The additional metal layer may be formed of a conductive metal material such as Al, Cu, Au or other suitable material. The additional metal layer under the first metal layer 121 prevents the silicon alloyed in the first metal layer 121 from remaining during patterning of the source electrode 125 and the drain electrode 127. Since the additional metal layer under the first metal layer 121 has a small thickness, for example, about 50–100 Å, silicon in the ohmic contact layer 119 and the active layer 117 diffuses slightly, thereby preventing contact spiking.

Figure 5D:
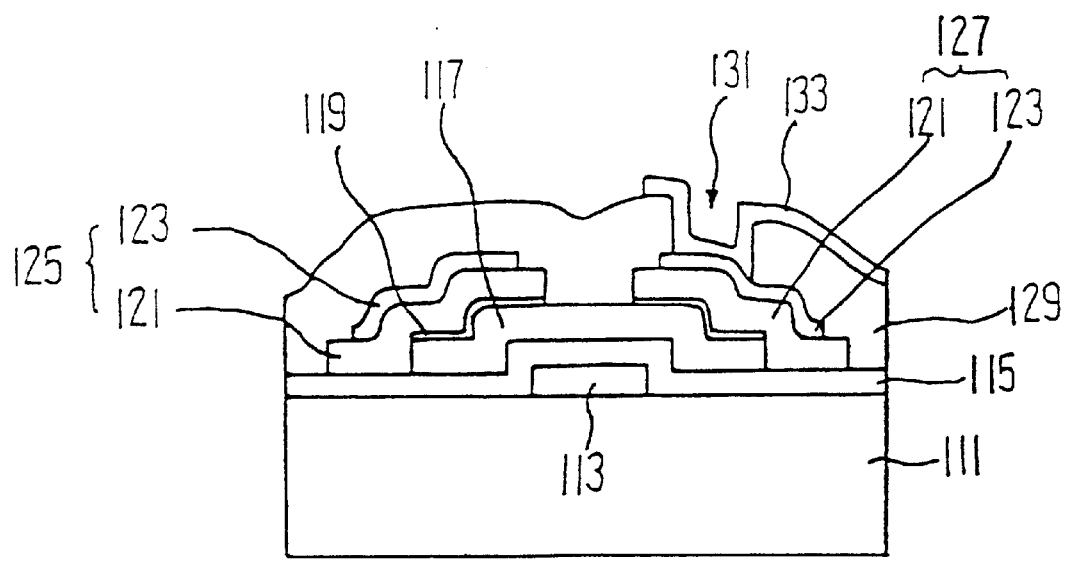

Referring to FIG. 5D, the photoresist pattern 128 on the second metal layer is removed. Then, a passivation layer 129 is deposited on the gate insulating layer 115 so as to cover the source and drain electrodes 125 and 127 and the exposed portion of the active layer 117. The passivation layer 129 may be formed of an insulating material such as, silicon oxide, silicon nitride or other suitable material. Since the source and drain electrodes 125 and 127 have a double-step difference, the deterioration of step coverage of the later-formed passivation layer 129 is prevented.

Then, a contact hole 131 is formed in the passivation layer 129 to expose a portion of the drain electrode 121. The second metal layer 125 of the drain electrode 127 is exposed. Then, the transparent conductive layer formed of transparent conductive material, such as ITO, is deposited on the passivation layer 129 and is etched by photolithography to form the pixel electrode 133. The pixel electrode 133 contacts the second metal layer 123 formed of Mo or Mo alloy, such as MoW, MoTa, MoNb or other suitable material and does not contact the first metal layer 121. Accordingly, the contact resistance of the pixel electrode 133 formed of ITO and the drain electrode 122 is reduced.

In this preferred embodiment of the present invention, the double-layered gate electrode includes the first metal layer having low electric resistance and exhibiting tensile stress, such as Al, Cu, Au or other suitable material and a second metal layer exhibiting compressive stress, such as Mo or Mo alloy including MoW, MoTa, MoNb may be formed.

FIGS. 6A to 6D are diagrams illustrating a process for fabricating the top gate type TFT according to a fourth preferred embodiment of the present invention.

Figure 6A:
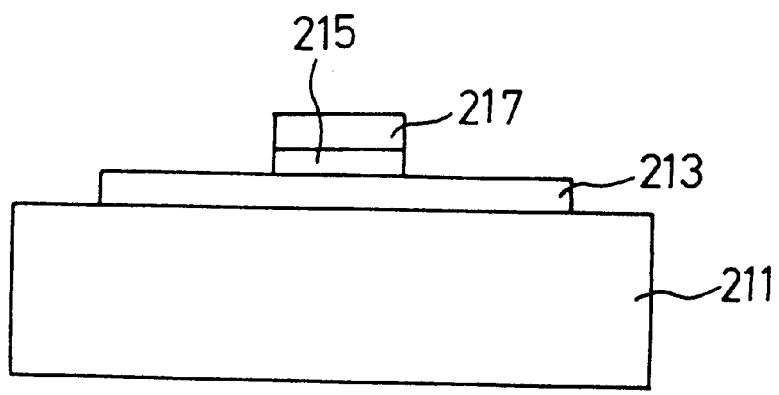
FIGS. 6A to 6D are diagrams illustrating the process for fabricating the top gate type TFT according to a fourth preferred embodiment of the present invention.

Referring to FIG. 6A, a semiconductor layer such as, an amorphous silicon layer, a polycrystalline silicon layer or other suitable layer is deposited on a substrate 211 by CVD and is etched by photolithography to form an active layer 213.

A gate insulating interlayer 215 is deposited by CVD on the substrate 211 to cover the active layer 213. The gate insulating interlayer 215 may be formed from an insulating material, such as silicon oxide, silicon nitride or other suitable material. Then, a conductive layer having a thickness of about 3000–4000 Å is deposited on the gate insulating layer 215 via CVD or PVD including sputtering and is etched by photolithography to form a gate electrode 213. Then, the gate insulating layer 215 may be etched using the gate electrode 213 as a mask.

Figure 6B:
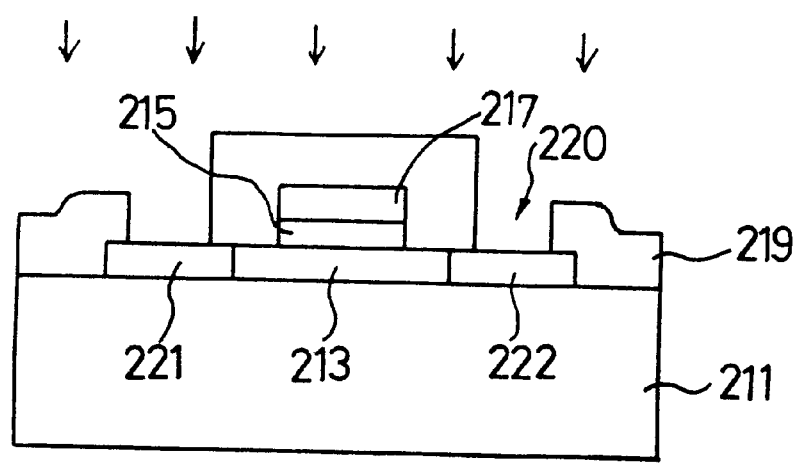

Referring to FIG. 6B, a source region 221 and a drain region 222 are formed in the active layer 213 by doping heavily N-type or P-type impurities in the exposed portion of the active layer 213. The channel region is defined between the source and drain regions 221 and 222 in the active layer 213. Then, an insulating interlayer 219 is deposited on the substrate 211 to cover the active layer 213 and the gate electrode 217. The insulating interlayer 219 may be formed from an insulating material, such as silicon oxide, silicon nitride or other suitable material. Then, the insulating interlayer 219 is etched by photolithography to form first contact holes exposing the source and drain regions 221 and 222, respectively.

Figure 6C:
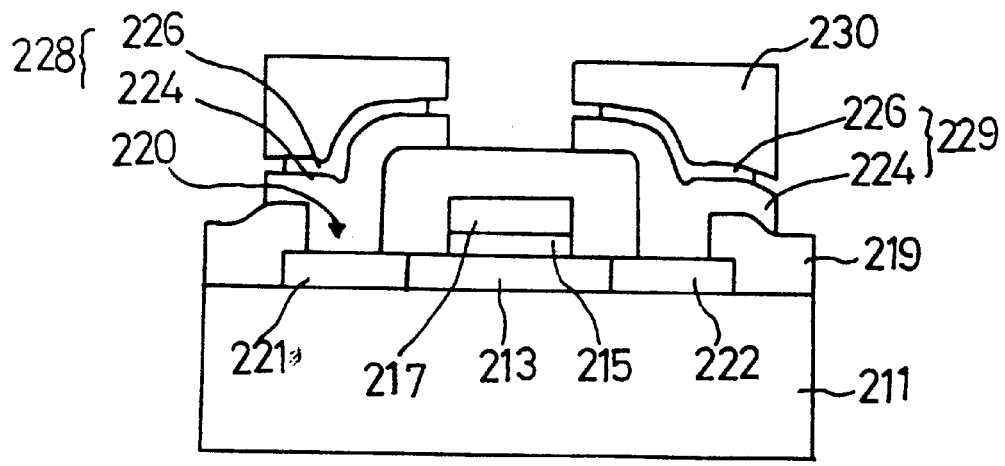

Referring to FIG. 6C, a first metal layer 224 and a second metal layer 226 are sequentially deposited on the surface of the exposed resultant substrate by CVD or PVD including sputtering. The first metal layer 224 may be formed from a conductive material having low electric resistance and exhibiting tensile stress, such as Al, Cu, Au or other suitable material, or metal-silicon alloy, such as AlSi, CuSi, AuSi or other suitable material and the second metal layer 226 may be formed of a conductive material exhibiting compressive stress, such as Mo or Mo alloy including MoW, MoTa, MoNb or other suitable material.

Then, a photoresist pattern 230 is formed on the second metal layer 226. The second metal layer 226 and the first metal layer 224 are sequentially etched using the photoresist pattern as a mask for etching to form a source region 228 and a drain region 229.

The second metal layer 226 is preferably etched to have a width that is narrower than the width of the photoresist pattern 230. Each side portion of the second metal layer 226 preferably has a width larger than about 1.0 μm and less than about 4 μm. That is, the two side portions of the second metal layer 226 covered with the photoresist pattern 230 are preferably etched to have substantially the same width as each other. The first metal layer 224 is etched by an anisotropic etching method, such as Reactive Ion Etching ("RIE") using the photoresist pattern 230 as a mask for etching. Thus, the first metal layer 226 is wider than the second metal layer by a predetermined width, for example, larger than about 1.0 μm and less than about 4 μm and the source and drain electrodes 228 and 229 have the double-step difference.

Accordingly, this preferred embodiment of the present invention prevents reduction in the switching speed of the TFT because of the first metal layer of the source electrode 228 and the drain electrode 229 have low electrical resistance and prevents the occurrence of hillock because the compressive stress of the second metal layer 226 minimizes the effect of the tensile stress of the first metal layer.

When the first metal layer 224 is formed by silicon alloy metal material, such as AlSi, CuSi, AuSi or the like, an additional metal layer (not shown in FIGS. 6A–6D) having a thickness of about 50–100 Å may be formed under the first metal layer 224. The additional metal layer may be formed of a conductive metal material such as Al, Cu, Au or other suitable material. The additional metal layer under the first metal layer 224 prevents the silicon alloyed in the first metal layer 224 from remaining during patterning of the source and drain electrodes 228 and 229. Also, since the additional metal layer under the first metal layer 224 has a small thickness, for example, about 50–100 Å, the active layer 213 diffuses slightly, thereby preventing contact spiking.

Figure 6D:
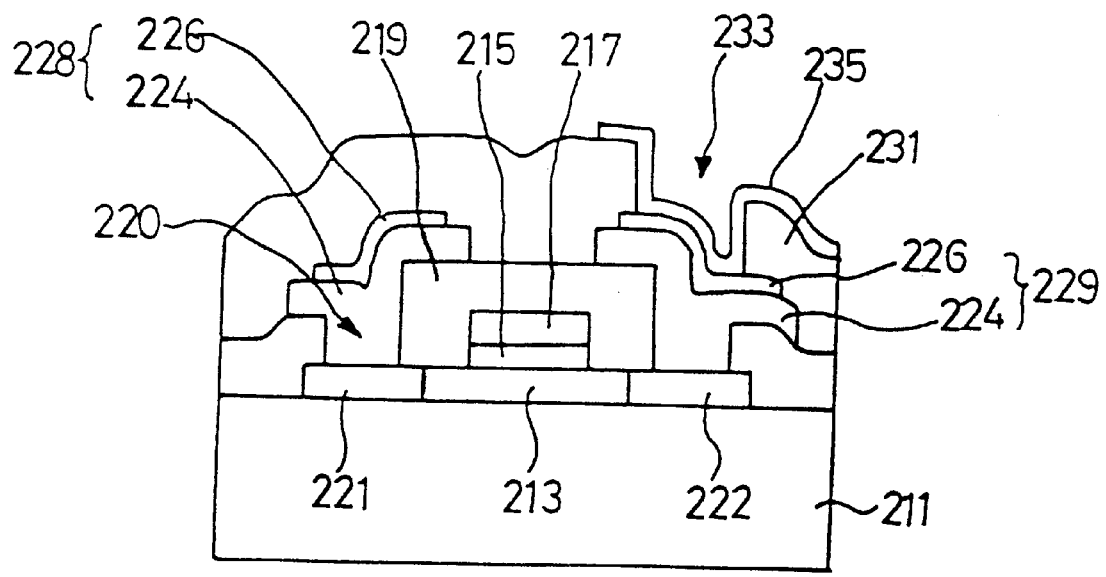

Referring to FIG. 6D, the photoresist pattern 230 on the second metal layer 226 is removed. Then, a passivation layer 231 is deposited on the insulating interlayer 219 covering the source and drain electrodes 228 and 229. The passivation layer 231 may be formed from an insulating material such as, silicon oxide, silicon nitride or other suitable material. Since the source and drain electrodes 228 and 229 have the double-step difference, the deterioration of step coverage of the later-formed passivation layer 231 is prevented.

Then, a second contact hole 233 is formed in the passivation layer 231 to expose a portion of the drain electrode 228. Then, the transparent conductive layer, formed of a transparent conductive material, such as ITO, is deposited on the passivation layer 231 and is etched by photolithography to form a pixel electrode 235. The pixel electrode 235 contacts the second metal layer 226 formed of Mo or Mo alloy, such as MoW, MoTa, MoNb or other suitable material and does not contact the first metal layer 224. Accordingly, the contact resistance of the pixel electrode 235 formed of ITO and the drain electrode 229 is reduced.

In this preferred embodiment of the present invention, the double-layered gate electrode of the first metal layer having low electric resistance and exhibiting tensile stress, such as Cu, Au or other suitable material and a second metal layer exhibiting compressive stress, such as Mo or Mo alloy including MoW, MoTa, MoNb may be formed as the source electrode 228 and the drain electrode 229.

Accordingly, preferred embodiments of the present invention prevent any reduction in TFT switching speed because of the first metal layer of the source electrode and the drain electrode having low electrical resistance and prevent the occurrence of hillock because the compressive stress of the second metal Layer minimizes the effect of the tensile stress of the first metal layer.

Also, any deterioration of step coverage of the later-formed passivation layer 231 is prevented by forming the source and drain electrodes 228 and 229 to have the double-step difference.

The contact resistance of the pixel electrode and the drain electrode is reduced by making the pixel electrode formed of ITO contact the second metal layer formed of Mo or Mo alloy, such as MoW, MoTa, MoNb or other suitable material and to not contact the first metal layer formed of Al, Cu, Au or other suitable material.

Although the present invention has been described in relation to particular preferred embodiments and examples thereof, many variations and modifications in other uses will become apparent to those skilled in the art. It is preferred, therefore, that the present invention be limited not by the specific disclosure herein, but only by the appended claims.

What is claimed is:

1. A thin film transistor (TFT) comprising:

a substrate;

a gate electrode on the substrate;

a gate insulating layer formed on the substrate and covering the gate electrode;

an active layer on the gate insulating layer;

an ohmic contact layer on the active layer and not overlapping the gate electrode; and a source electrode and a drain electrode connected to the ohmic contact layer, each of the source electrode and the drain electrode having a double-layered structure of a first metal layer having tensile stress and a second metal layer having compressive stress, the second metal layer being disposed on the first metal layer such that two side portions of the first metal layer do not have a portion of the second metal layer disposed thereon and the two side portions have the same width as each other, wherein the tensile stress of the first metal layer and the compressive stress of the second metal layer combine to prevent a hillock from occurring at the source electrode and the drain electrode.

2. The TFT according to claim 1, wherein the first metal layer is wider than the second metal layer by about 1 μm to about 4 μm.

3. The TFT according to claim 2, wherein the first metal layer is formed of a conductive material including at least one of Al, Cu or Au.

4. The TFT according to claim 2, wherein the first metal layer is formed of an Al alloyed conductive material including at least one of AlSi, CuSi or AuSi.

5. The TFT according to claim 4, further comprising an additional conductive layer including a conductive material such as Al, Cu, or Au, the additional conductive layer being deposited under the first metal layer.

6. The TFT according to claim 2, wherein the second metal is formed of Mo or a Mo alloy including MoW, MoTa or MoNb.

7. The TFT according to claim 1, further comprising a passivation layer on the gate insulating layer and connected to the source and the drain electrodes;

a contact hole in the passivation layer exposing the drain electrode; and a pixel electrode on the passivation layer and connected to the drain electrode through the contact hole.

8. The TFT according to claim 1, wherein the pixel electrode is connected to the second metal layer of the drain electrode.

9. The thin film transistor according to claim 1, further comprising a passivation layer on the source electrode and the drain electrode, wherein the passivation layer directly contacts the active layer without any other layer being disposed between the active layer and the passivation layer.

10. A thin film transistor (TFT) comprising:

a substrate;

an active layer on the substrate;

a gate insulating layer on the active layer;

a gate electrode on the gate insulating layer;

a source region and a drain region on both sides of the active layer;

an insulating interlayer formed on the substrate and covering the active layer and the gate electrode;

first contact holes formed in the insulating interlayer and exposing the source region and the drain region, respectively; and a source electrode connected to the source region and a drain electrode connected to the drain region, each of the source electrode and the drain electrode having a double layered structure of a first metal layer having tensile stress and a second metal layer having compressive stress, and the second metal layer is located in a middle portion of the first metal layer so that two side portions of the first metal layer having no portion of the second metal layer disposed thereon have the same width as each other, wherein the tensile stress of the first metal layer and the compressive stress of the second metal layer combine to prevent a hillock from occurring at the source electrode and the drain electrode.

11. The TFT according to claim 10, wherein the first metal layer is wider than the second metal layer by about 1 μm to about 4 μm.

12. The TFT according to claim 11, wherein the first metal layer is formed of a conductive material including at least one of Al, Cu or Au.

13. The TFT according to claim 11, wherein the first metal layer is formed of Al alloyed conductive material including at least one of AlSi, CuSi or AuSi.

14. The TFT according to claim 13, further comprising an additional conductive layer formed of a conductive material including at least one of Al, Cu or Au, the additional conductive layer is located under the first metal.

15. The TFT according to claim 11, wherein the second metal layer is formed of Mo or a Mo alloy including MW, MoTa or MoNb.

16. The TFT according to claim 10, further comprising a passivation layer arranged on the insulating interlayer so as to cover the source electrode and the drain electrode; a second contact hole in the passivation layer exposing the drain electrode; and a pixel electrode on the passivation layer and connected to the drain electrode.

17. The thin film transistor according to claim 10, further comprising a passivation layer on the source electrode and the drain electrode, wherein the passivation layer directly contacts the active layer without any other layer being disposed between the active layer and the passivation layer.

18. A method for fabricating a thin film transistor, comprising the steps of:

providing a substrate;

forming a gate electrode on the substrate;

forming a gate insulating layer on the substrate, the gate insulating layer covering the gate electrode;

forming an active layer and an ohmic contact layer on the gate insulating layer, the ohmic contact layer being disposed on the active layer; and forming a source electrode and a drain electrode connected to the ohmic contact layer and such that each of the source electrode and the drain electrode have a double-layered structure of a first metal layer having tensile stress and a second metal layer having compressive stress, and the second metal layer is located on the first metal layer and two side portions of the first metal layer having no portion of the second metal layer disposed thereon have the same width as each other, wherein the tensile stress of the first metal layer and the compressive stress of the second metal layer combine to prevent a hillock from occurring at the source electrode and the drain electrode.

19. The method according to claim 18, wherein the first metal layer and the second metal layer are formed by using an etching solution prepared with a mixture of phosphoric acid, acetic acid and nitric acid.

20. The method according to claim 18, wherein the first metal layer is wider than the second metal layer by about 1 μm to 4 μm.

21. The method according to claim 20, wherein the first metal layer is formed of a conductive material including at least one of Al, Cu or Au.

22. The method according to claim 20, wherein the second metal layer is formed of an Al alloyed conductive material including at least one of AlSi, CuSi or AuSi.

23. The method according to claim 21, further comprising forming an additional conductive layer formed of a conductive material including at least one of Al, Cu or Au, the additional conductive layer is formed under the first metal layer.

24. The method according to claim 20, wherein the second metal layer is formed of Mo or a Mo alloy including at least one of MoW, MoTa or MoNb.

25. The method according to claim 18, further comprising the steps of:

forming a passivation layer on the gate insulating layer, so that the passivation layer covers the source electrode and the drain electrode;

forming a contact hole in the passivation layer so as to expose the drain electrode; and forming a pixel electrode on the passivation layer so as to be connected to the drain electrode.

26. The method according to claim 18, further comprising forming a passivation layer on the source electrode and the drain electrode, wherein the passivation layer directly contacts the active layer without any other layer being disposed between the active layer and the passivation layer.

* * * * *